United States Patent
Greenlaw et al.

[11] Patent Number: 6,096,628
[45] Date of Patent: Aug. 1, 2000

[54] METHOD OF CONTROLLING EFFECTIVE CHANNEL LENGTH OF SEMICONDUCTOR DEVICE BY NON-DOPING IMPLANTATION AT ELEVATED ENERGIES

[75] Inventors: David C. Greenlaw; Jan Raebiger, both of Dresden, Germany

[73] Assignee: Advanced Micro Devices, Inc., Sunnyvale, Calif.

[21] Appl. No.: 09/187,524

[22] Filed: Nov. 6, 1998

[51] Int. Cl.[7] .................................................. H02L 21/425
[52] U.S. Cl. ................................... 438/530; 148/DIG. 32
[58] Field of Search .................................... 438/530, 542, 438/549, 555, 289, 305, 306; 148/DIG. 32

[56] References Cited

U.S. PATENT DOCUMENTS 4,683,645  8/1987  Naguib et al. .
4,835,112  5/1989  Pfiester et al. .

OTHER PUBLICATIONS

Ozturk et al., Appl. Phys. Lett. 52 (12), pp. 963–965, Mar. 21, 1988.
Wolf et al., Silicon processing for the VLSI era, V1, p. 327, 1986.
Hsiao et al., An Advanced Ge Preamophization Salicide Tech. for Ultra Thin Film SOI CMOS Devices, IEEE, pp. 309–311, 1997.
Segawa et al., A .18 um Ti–Salicided p–MOSFET with Shallow Junctions, Fabricated by RTP in an NH3 Ambient, IEEE, pp. 443–446, 1996.

*Primary Examiner*—Charles Bowers
*Assistant Examiner*—Scott J. Hawranek

[57] ABSTRACT

A semiconductor device and a method of manufacturing a semiconductor device with an effective channel length that is less than the physical gate length avoids requiring improving the masking, lithography and etching process steps by increasing the implantation energy of a pre-amorphizing implant. The pre-amorphizing implant is performed after the doping of the source and drain areas and after activation of the dopants. The implantation energy is sufficient to introduce damage into the substrate to allow for increased movement of the dopants in the substrate. Subsequent annealing steps performed during silicidation cause the source and drain areas to expand toward each other and reduce the effective channel length. This channel length reduction leads to improved device performance through higher $I_{dsat}$, etc.

12 Claims, 6 Drawing Sheets

METHOD OF CONTROLLING EFFECTIVE CHANNEL LENGTH OF SEMICONDUCTOR DEVICE BY NON-DOPING IMPLANTATION AT ELEVATED ENERGIES

FIELD OF THE INVENTION

The present invention relates to the field of semiconductor device manufacture, and more particularly, to controlling the channel length of channels in semiconductor devices.

BACKGROUND OF THE INVENTION

The effective channel length ($L_{eff}$) of a transistor is a critical device parameter as the drain current depends very sensitively on it. The conventional method of controlling the effective channel length is performed during the manufacturing of the semiconductor device by controlling the printed gate width. This is a very complicated process in which photolithography is employed to transform complex circuit diagrams into patterns which are defined on the semiconductor wafer in a succession of exposure and processing steps to form a number of superimposed layers of insulator, conductor and semiconductor materials. In photolithography, a light source is used to flood a photomask with light. The photomask carries the mask pattern of the circuit to be patterned on the semiconductor wafer. The flooding of the photomask with light causes the mask pattern to be transferred to a layer of photoresist that has been deposited on the semiconductor wafer. The photoresist is developed and unreacted areas are developed away, leaving the desired pattern and circuit features in the photoresist layer.

Following photolithography, appropriate processing steps, including etching, are then performed to produce the desired circuit structure. Etching, for example, involves the selective removal of material, either locally where windows are defined, or over the entire wafer without patterning. The etching process can be a complex process within the overall semiconductor manufacturing process, involving masking, precise control of etch times, etch chemistries, etc. in order to precisely form desired features.

One of the circuit features that must be well controlled is the physical gate length. As stated earlier, this is a very complicated process, requiring precise process control. Numerous effects from a number of process steps influence the actual physical gate length (i.e., the width of the gate produced by the photolithographic process). These steps include the preparation of the mask, lithography, and etching, any and all of which can cause unwanted variation in the physical gate lengths. Further, different process steps may have different impacts on different gate widths.

One of the advantages achieved by reducing the gate length is the increase in circuit speed. Traditionally, the focus of research to achieve submicron feature sizes has been in the lithography and etching areas. However, improvements in reducing the feature size are difficult to achieve in these areas, as it involves increased manufacturing costs and improved process control.

SUMMARY OF THE INVENTION

There is a need for a method of reducing the effective channel length that does not require improvements in the masking, lithography, or etching processes, yet does not adversely impact device performance.

This and other needs are met by embodiments of the present invention which provide a method of controlling effective channel length in a semiconductor device, comprising the steps of forming a semiconductor device having source and drain areas and a printed channel length of $L_{drawn}$. Non-dopant material is implanted into the source and drain areas at an implantation energy sufficient to partially amorphize the source and drain areas and reduce the channel length to an effective channel length of $L_{eff}$, where $L_{drawn} > L_{eff}$.

One of the advantages of the present invention is the elegant manner in which the channel length is effectively reduced, without requiring costly and difficult improvements in any of the masking, lithography and etching processes. By changing only the pre-amorphization implantation energy, the channel length is effectively reduced during subsequent annealing steps in a silicidation process. This allows relatively inexpensive semiconductor manufacturing machines to be employed to produce devices with larger initial physical gate lengths, whose channel lengths can then be effectively reduced by changing the implantation energies. However, if the smallest physical gate lengths currently available are utilized, the effective channel length can be reduced even further beyond the limitations of current masking, lithography and etching technology. Reduced effective channel length improves device performance.

Additional features and advantages of the present invention will become readily apparent to those skilled in this art from the following detailed description, wherein embodiments of the invention are described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE INVENTION

The present invention relates to methods for reducing the effective channel length of semiconductor devices in a scaleable and readily controllable manner, without requiring improvements in masking, lithography and etching techniques. The invention accomplishes this by increasing the energies at which the pre-amorphizing implantation is performed. This has the effect of introducing sufficient damage into the semiconductor device substrate (partially amorphize the substrate) so that the dopants already in the substrate are activated to move more within the substrate than if the damage had not been introduced. The added movement of the dopants within the substrate causes the sources and drains to expand toward each other, effectively reducing the length of the channel below the printed gate width. With reduced effective channel length, the speed of the semiconductor devices on a chip will be increased.

Figure 1:
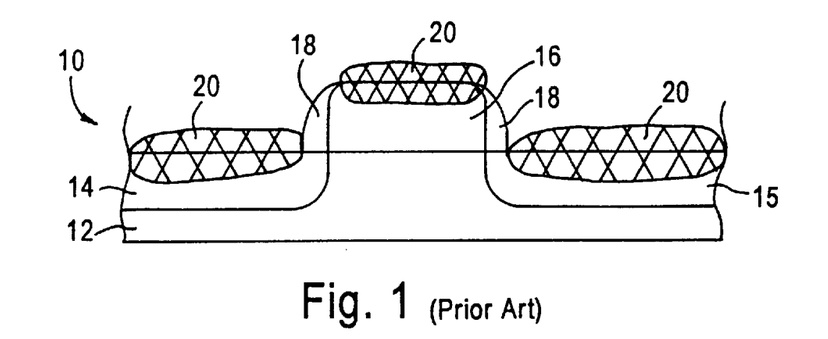
FIG. 1 is a cross-sectional schematic view of a semiconductor device manufactured according to prior art methodology and having an effective channel length approximately equal to the printed gate width.

FIG. 1 depicts a cross-section of a semiconductor device 10 manufactured in accordance with prior art methodology. The device 10 includes a substrate 12 in which a source region 14 and a drain region 15 are created by implanting dopants and then activating the dopants. A polysilicon gate 16 is formed over the substrate 12 with dielectric spacers 18. Metal silicide regions 20 are formed in and on the source and drain regions 14, 15 and the polysilicon gate 16. Examples of suicides, which provide good electrical contact to the semiconductor device 10 and lower the sheet resistance, are cobalt silicide ($CoSi_2$) and titanium siuicide ($TiSi_2$).

The distance between the source region 14 and the drain region 15 is defined as the effective length ($L_{eff}$) of the channel. In the prior art device of FIG. 1, the effective channel length is substantially equal to the physical gate length, i.e., the drawn length ($L_{drawn}$) of the channel. Thus, the channel length of the prior art semiconductor device is limited by the technology of the masking, lithography and etching steps capable of producing the given physical gate length. The present invention overcomes the physical gate length limitations without requiring improvements in these steps, as will become apparent from the following description of FIGS. 2–11.

Figure 2:
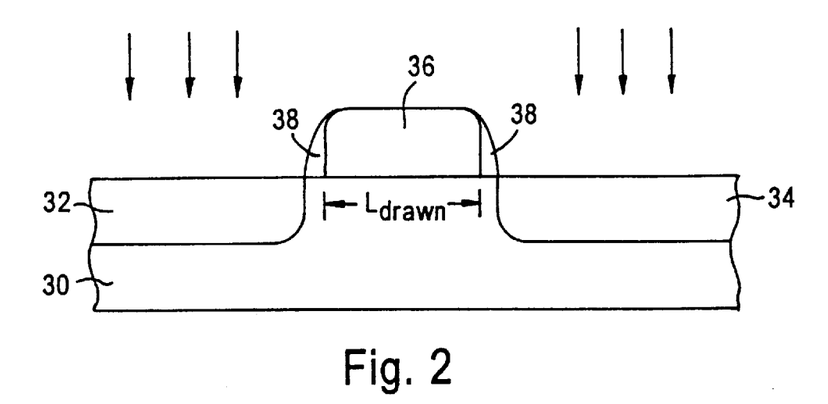
FIG. 2 is a cross-sectional schematic view of a semiconductor device partially manufactured in accordance with embodiments of the present invention, during a dopant implantation step.
Figure 3:
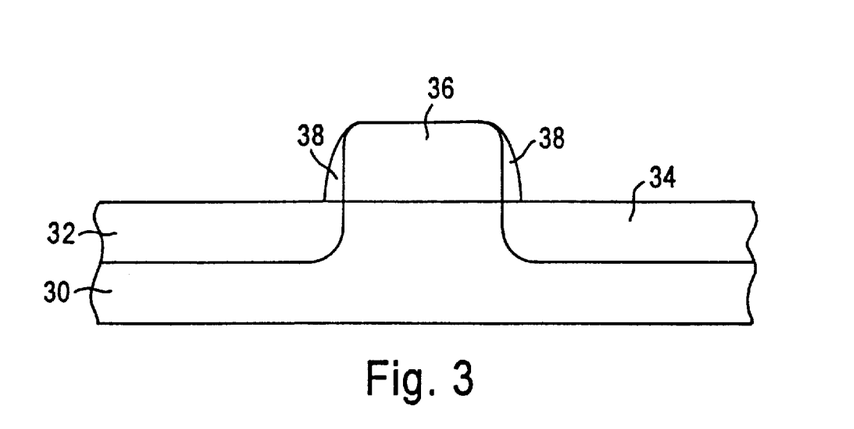
FIG. 3 is a cross-sectional view of the semiconductor device of FIG. 2 after an annealing step to activate the dopants in accordance with embodiments of the present invention.

FIG. 2 depicts a cross-sectional schematic view of a semiconductor device during its manufacture in accordance with embodiments of the present invention. At this stage of manufacture, dopants (such as boron or phosphorous) are implanted in a conventional manner into a substrate 30 to form a source region 32 and a drain region 34. Appropriate implantation masking is employed so that the dopants are implanted in the proper regions. A polysilicon gate 36 having a physical gate length $L_{drawn}$ overlies the substrate 30, and spacers 38 are provided on the sides of the gate 36. An anneal step is then performed, as depicted in FIG. 3, to activate the dopants and create the source region 32 and the drain region 34.

Figure 4:
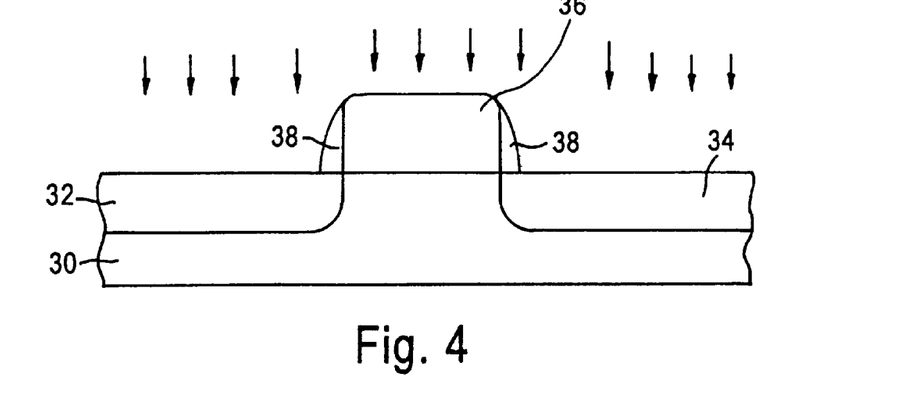
FIG. 4 is a cross-sectional view of the semiconductor device of FIG. 3, during the pre-amorphization implantation in accordance with embodiments of the present invention.

A pre-amorphization step is now performed, as depicted in FIG. 4. The purpose of the pre-amorphization step is to amorphize the surface of the substrate 30 to facilitate the silicide process to follow. This is typically accomplished by implanting a non-dopant material into the substrate. Such materials include semiconductor materials, metals and noble gases, for example. In the exemplary preferred embodiment of the invention, silicon is implanted into the substrate 30. Other typical implant material may be germanium (Ge), molybdenum (Mo), etc.

In conventional pre-amorphization, the implanting is performed with an energy level just sufficient to amorphize the surface of the substrate 30. For example, with a typical junction depth of 1500 Å depth (n-type device), a 10 keV implantation energy is employed to implant silicon into silicon and amorphize approximately 350 to 400 Å of silicon. Such an implantation energy level does not substantially affect the effective channel length, so that it remains at approximately the drawn channel length ($L_{eff}=L_{drawn}$). However, the present invention reduces the effective channel length by implanting at implantation energy levels greater than those sufficient to amorphize the surface of the substrate 30. For example, if the junction depth is 1500 Å, the implantation energy to implant silicon in silicon may be 20 keV or 30 keV. This greater implantation energy used in the present invention is sufficient to introduce enough damage into the substrate 30. The dopants that are already in the substrate 30 will be able to move more in subsequent annealing steps than if the damage had not been introduced by the high energy implantation of the non-dopant material.

The level of energy sufficient to introduce damage into the substrate sufficient to reduce the effective channel length depends on a number of factors, such as the material being implanted and the depth of the junction. For example, greater implantation energy is required if the junction depth is greater to introduce the requisite amount of damage sufficient to reduce the effective channel length of the device. Alternatively, as the depths of junctions become shallower with advances in processing technology, the requisite implantation energy will also be reduced.

The present invention provides the advantage of easily achieved reductions in effective channel length. As will be described in more detail later with respect to FIGS. 9–11, the effective channel length can be reduced a desired amount by increasing the implantation energy of the per-amorphization implant an appropriate amount.

Figure 5:
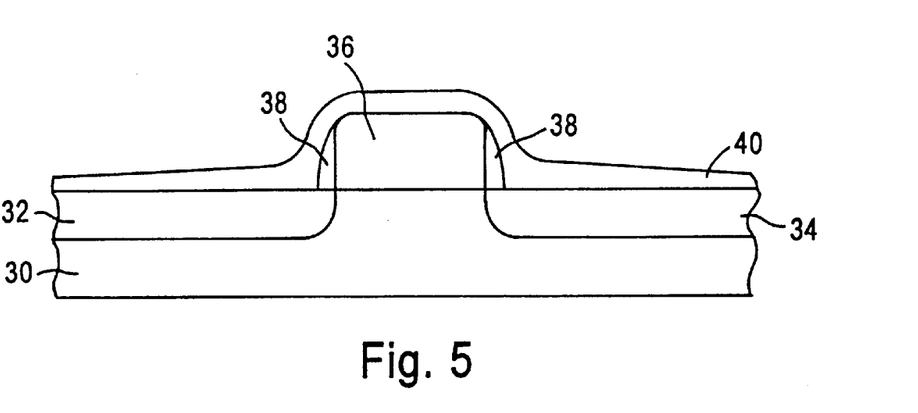
FIG. 5 is a cross-sectional view of the semiconductor device of FIG. 4 after the deposition of a refractory metal layer in accordance with embodiments of the present invention.

Once the non-dopant, such as silicon, is implanted into the substrate 30 and introduces damage into the substrate 30, the manufacturing process continues as in conventional semiconductor device manufacturing. As depicted in FIG. 5, a refractory metal layer 40 is deposited over the wafer, blanketing the substrate 30, source region 32, drain region 34, gate 36, and spacers 38. The metal layer 40 may comprise different metals, such as titanium (Ti), cobalt (Co), etc.

Figure 6:
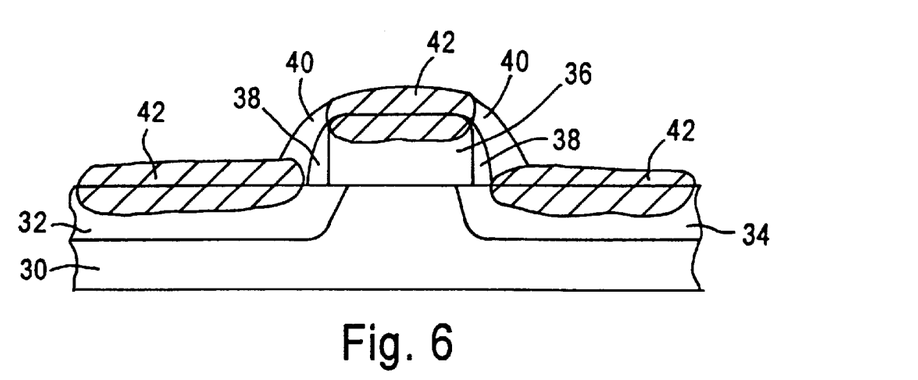
FIG. 6 is a cross-sectional view of the semiconductor device of FIG. 5 following a second annealing step to form a first phase of a metal silicide in accordance with embodiments of the present invention.

A metal silicide is then formed, as depicted in FIG. 6, by performing a rapid thermal anneal step. This creates a first phase of the metal silicide, which typically exhibits higher resistance than a second phase. For example, the first rapid thermal anneal step after deposition, where titanium is the refractory metal, creates TiSi regions 42. These monosilicide regions 42 will be transformed into the lower resistivity disilicide regions $TiSi_2$ during an additional rapid thermal anneal step.

At the same time as the silicide regions 42 are being formed by the rapid thermal annealing, the dopants already in the substrate are caused to move more by the elevated temperatures present during the annealing. The source region 32 and the drain region 34 expand towards each other from their original areas (shown in phantom lines), as depicted in FIG. 6. The expansion of the source region 32 and the drain region 34 towards one another reduces the effective channel length below the drawn channel length.

Figure 7:
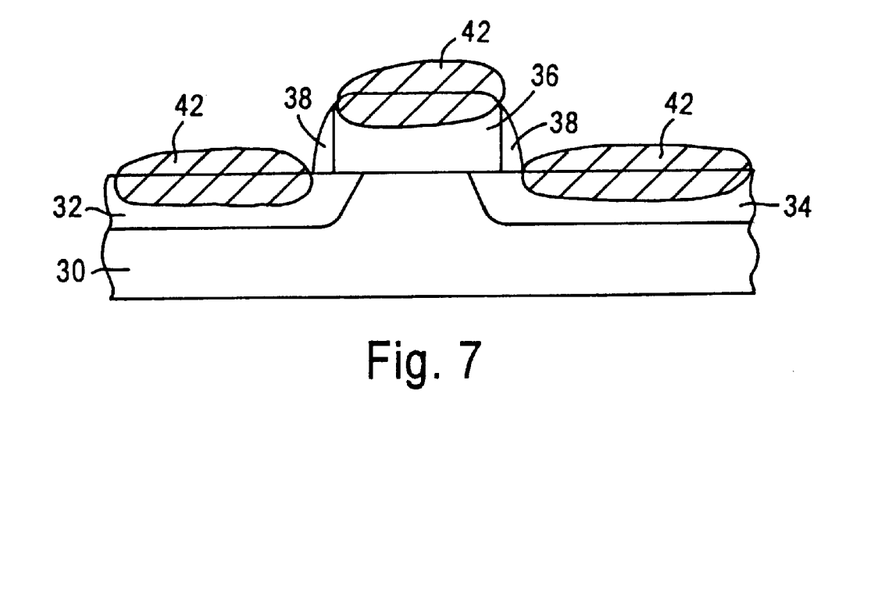
FIG. 7 is a cross-sectional view of the semiconductor device of FIG. 6 after unreacted metal in the refractory metal layer is removed in accordance with embodiments of the present invention.
Figure 8:
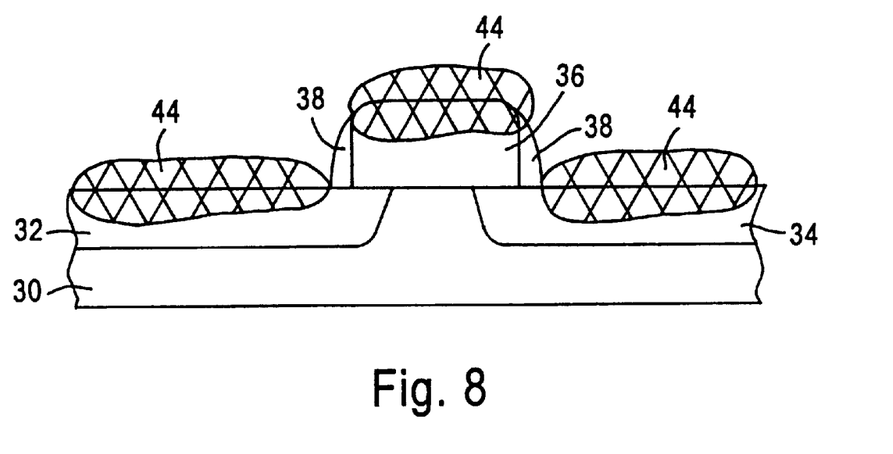
FIG. 8 is a cross-sectional view of the semiconductor device of FIG. 7 following a third annealing step to form a second, lower resistivity phase of the metal silicide in accordance with embodiments of the present invention.

Unreacted metal 40 is removed in FIG. 7 in a conventional manner, leaving the silicide regions 42. A further rapid anneal step is now performed to transform the monosilicide to a disilicide. Thus, in the exemplary embodiment of FIG. 8, the TiSi regions 42 are transformed during the further rapid thermal anneal step to $TiSi_2$ regions 44. This further rapid thermal anneal step is typically performed at higher temperatures than in the previous rapid thermal anneal step that created the monosilicide.

As during the first rapid thermal anneal step, the dopants are able to move even more during the second rapid thermal anneal step, due to the earlier introduced damage to the substrate, so that the source region 32 and the drain region 34 again expand towards each other. This reduces the effective channel length even further, to that indicated as $L_{eff}$ in FIG. 8. The effective channel length $L_{eff}$ can be compared to the drawn channel length $L_{drawn}$ in FIG. 8.

As can be ascertained from the above process description, the effective channel length is reduced according to the present invention without adding additional process steps. The increased movement of the dopants and the greater expansion of the source region 32 and the drain regions 34 towards each other occurs during the silicidation process, which remains unchanged. Hence, by increasing the energy of the pre-amorphization implants to a level sufficient to introduce damage, the effective channel length is reduced without improving any of the masking, lithography and etching steps. Another advantage of the present invention is that the control of the effective channel length by control of the pre-amorphization implant energy is a much easier task than controlling the effective channel length by control of the lithography and etching processes.

Figure 9:
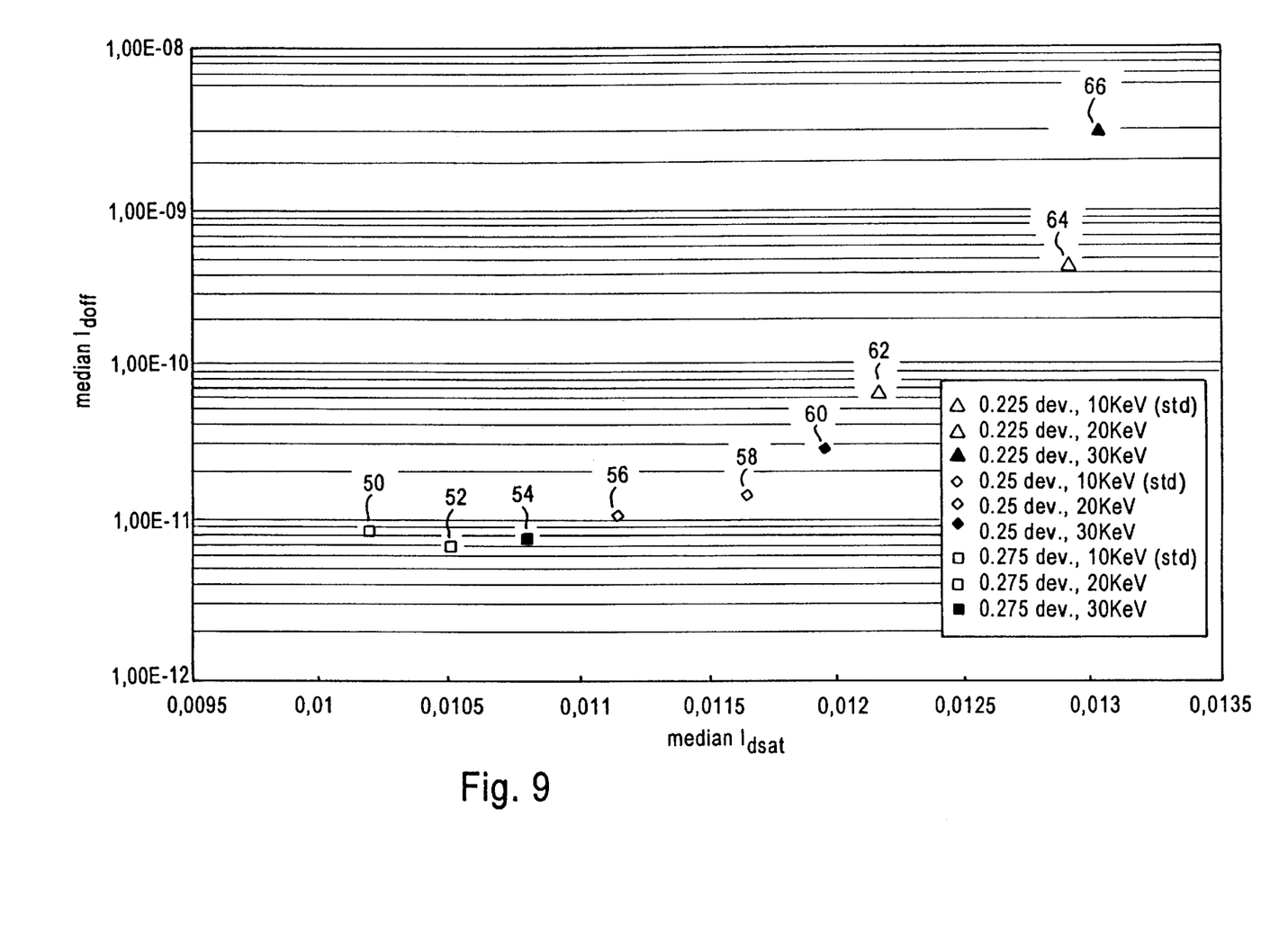
FIG. 9 is a plot of exemplary values of the drain off current ($I_{doff}$) vs. drain saturation current ($I_{dsat}$) for semiconductor devices processed in accordance with embodiments of the present invention with pre-amorphization implantation performed at different implantation energies for the different semiconductor devices.
Figure 10:
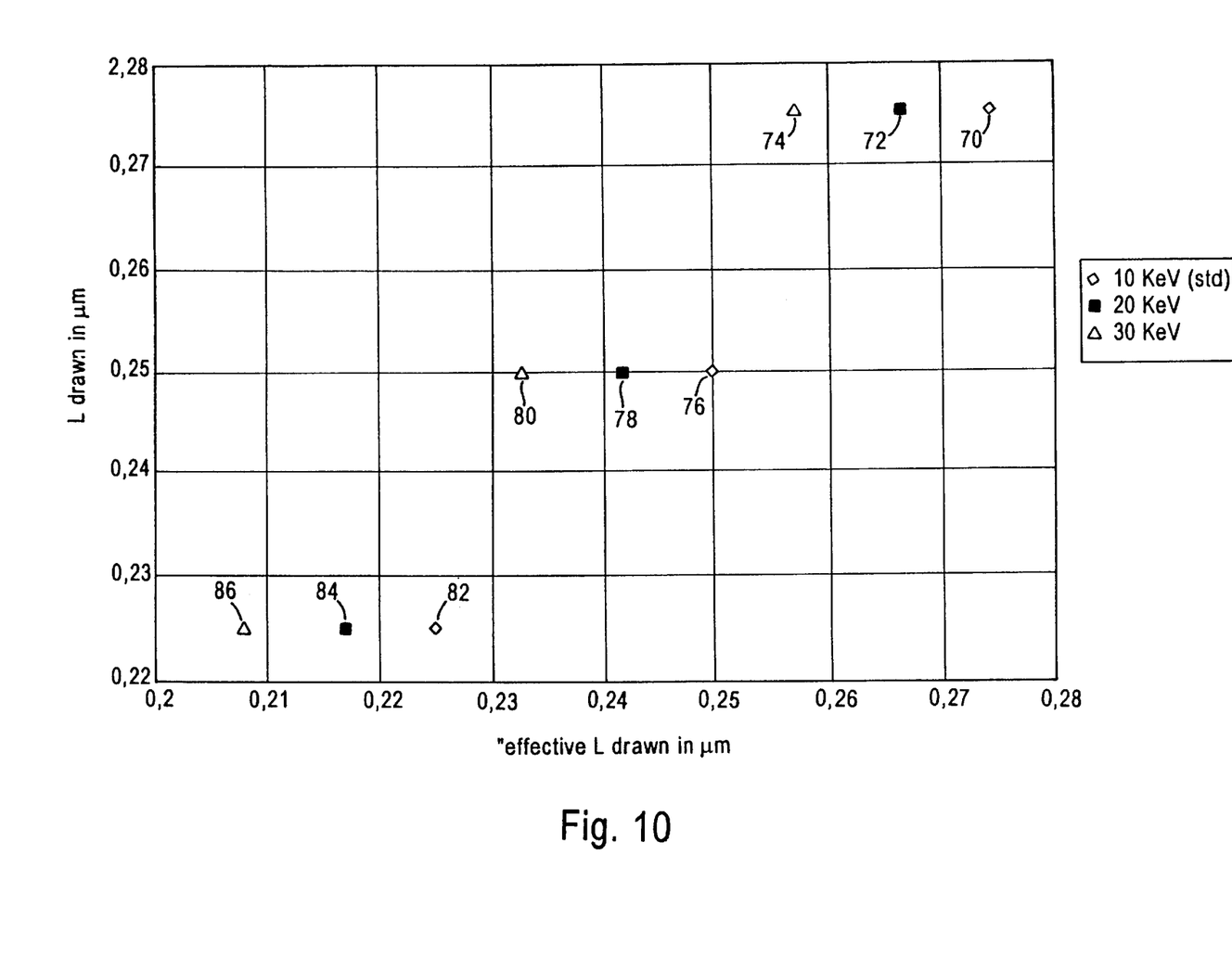
FIG. 10 is a plot of the drawn channel length vs. the effective channel length as derived from the exemplary plot of FIG. 9.
Figure 11:
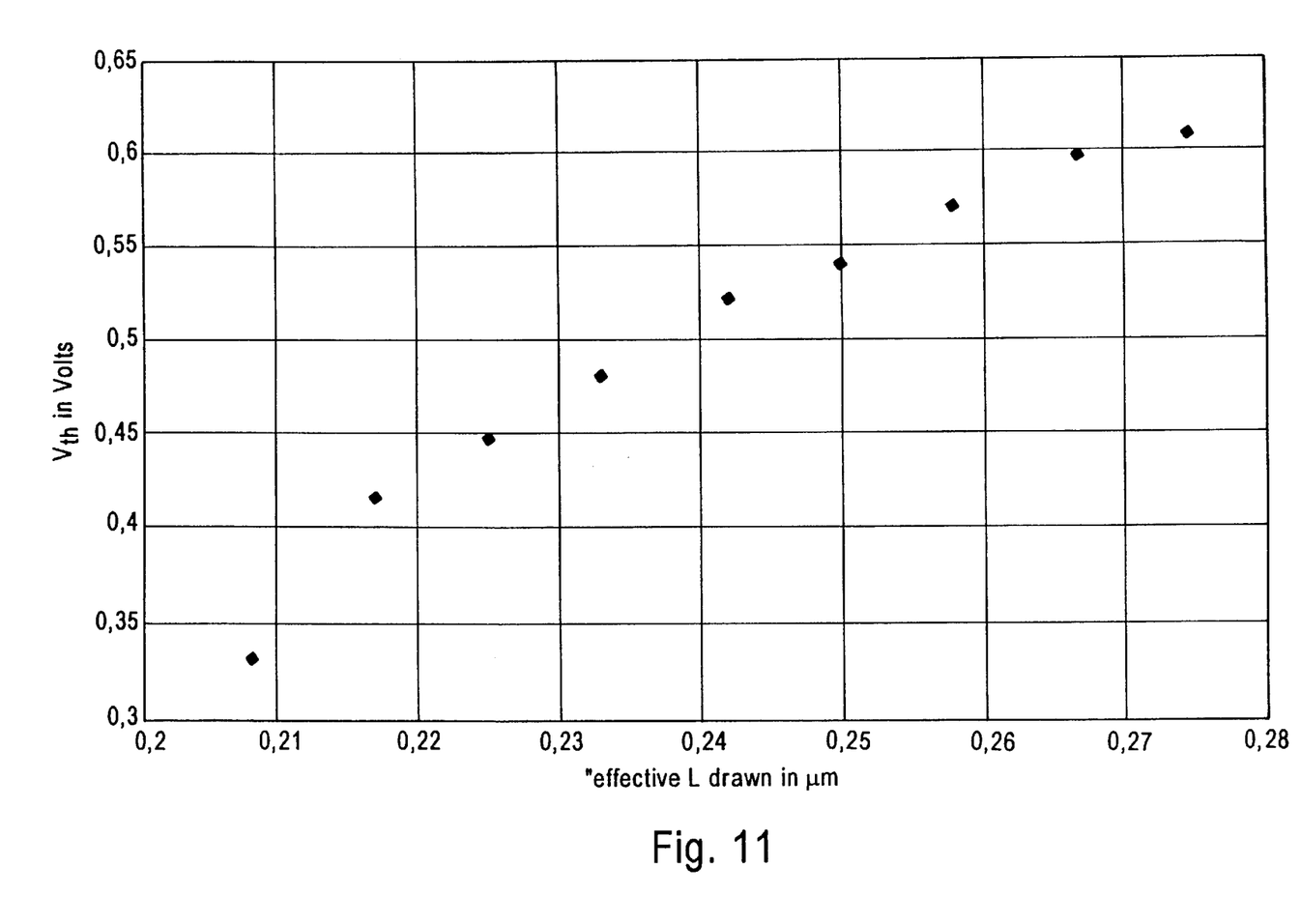
FIG. 11 is a plot of threshold voltage ($V_{TH}$) vs. effective channel length ($L_{eff}$) for semiconductor devices processed in accordance with embodiments of the present invention with pre-amorphization implantation performed at different implantation energies for the different semiconductor devices.

FIGS. 9–11 are plots that provide exemplary data for different implantation energies to show the relationship between implantation energy and the reduction of effective channel length, in accordance with embodiments of the present invention.

The turn off drain current ($I_{doff}$) is plotted against the saturation drain current ($I_{dsat}$) in FIG. 9. The turn off drain current $I_{doff}$ is the current that flows through the semiconductor device when it is turned off. It is normally desirable for this to be as low as possible. The saturation drain current $I_{dsat}$ is the current that flows when the transistor is turned on. The plot depicts three different examples of physical gate length, and compares the currents at each of these three different physical gate lenghts when three different pre-amorphization implantation energies are employed. For example, in FIG. 9, plot point 50 represents $I_{doff}$ VS. $I_{dsat}$ for a semiconductor device having a printed channel length of 0.275 μm, with a standard pre-amorphization implantation energy of 10 keV. Plot point 52 represents the same physical gate length, but with a pre-amorphization implantation energy of 20 keV, and plot point 54 has a pre-amorphization implantation energy of 30 keV. Similarly, plot points 56-60 represent three different semiconductor devices, each having a physical gate length of 0.250 μm, with pre-amorphization implantation energies of 10 keV, 20 keV, and 30 keV respectively. Finally, plot points 62–66 represent three different semiconductor devices, each having a physical gate length of 0.225 μm, with pre-amorphization implantation energies of 10 keV, 20 keV, and 30 keV respectively.

The plot points comparing $I_{doff}$ and $I_{dsat}$ in FIG. 9 for the three different initial physical gate lengths demonstrate the effect of increasing the pre-amorphization implantation energy on the turn off drain current and the saturation drain current. For each physical gate length, the plot point moves to the right on the chart as the pre-amorphization implantation energy is increased, just as though the gate length itself were being reduced.

The printed gate width, $L_{drawn}$, is plotted against the effective channel length, $L_{eff}$, for three different implantation energies in FIG. 10. The data points in this plot are derived from the plot points of FIG. 9. Plot points 70–74 depict the reduction in effective channel length $L_{eff}$ for a given physical gate length, when elevated pre-amorphization implantation energies are used to introduce damage into the substrate. For example, plot points 70–74 all have the same physical gate length, 0.275 μm. However, plot point 70 had a pre-amorphization implantation with an energy of 10 keV, which produced an effective channel length $L_{eff}$ of 0.275 μm. Another semiconductor device, represented by plot point 72, having the same physical or drawn gate length $L_{drawn}$ but a higher pre-amorphization implantation energy of 20 keV, has an effective channel length of approximately 0.267 μm. Similarly, a further semiconductor device, represented by plot point 74, having the same physical gate length $L_{drawn}$ but a still higher pre-amorphization implantation energy of 30 keV, has an effective channel length of approximately 0.258 μm.

Plot points 76–80 depict the reduction in effective channel length for semiconductor devices having physical gate lengths $L_{drawn}$ of 0.250 μm, at three different pre-amorphization implant energies. Similarly, points 82–86 depict the reduction in effective channel length for semiconductor devices having physical gate lengths $L_{drawn}$ of 0.225 μm, at three different pre-amorphization implant energies.

FIG. 10 graphically depicts the relationship between the effective channel length and the elevation of the pre-amorphization implantation energy to a level sufficient to partially amorphize the substrate. This elevation does not involve altering the masking, lithography, and etching steps, yet still reduces the channel length in a controllable and scaleable manner.

Although some specific values of implantation energies are provided in this description and in the Figures, these values are exemplary only, as the values will change depending on the implantation species used, the material into which the implantation is being performed, the depth of the junctions, etc.

FIG. 11 is a plot of measured experimental values of the threshold voltage rolloff ($V_{TH}$) as a function of the effective channel length $L_{eff}$. The plotted points form an essentially straight line. This is substantially the same relationship that is expected when the actual physical gate length is reduced, demonstrating that reducing the effective channel length in accordance with the present invention actually has substantially the same effect as reducing the physical gate length, but at much lower process development costs and efforts.

Only the preferred embodiment of the invention and but a few examples of its versatility are shown and described in the present disclosure. It is to be understood that the present invention is capable of use in various other combinations and environments and is capable of changes and modification within the scope of the inventive concept as expressed herein.

What is claimed is:

1. A method of controlling effective channel length in a semiconductor device, comprising the steps of:

forming a semiconductor device having source and drain areas and a physical channel length of $L_{drawn}$; and implanting non-dopant material into the source and drain areas at an implantation energy level between 10–30 keV sufficient to damage the source and drain areas to enhance the diffusion of source and drain dopants to reduce the channel length to an effective channel length of $L_{eff}$, where $L_{drawn} > L_{eff}$.

2. The method of claim 1, wherein the implantation energy is greater than about 15 keV.

3. The method of claim 1, wherein the implantation energy is greater than about 25 keV.

4. The method of claim 1, wherein the non-dopant material is silicon.

5. The method of claim 4, wherein the step of implanting non-dopant material into the source and drain areas includes amorphizing the source and drain areas for source and drain silicidation.

6. The method of claim 1, wherein the step of forming a semiconductor device includes implanting dopants into the source and drain areas and annealing to activate the dopants, and wherein the step of implanting non-dopant material is performed after activation of the dopants.

7. The method of claim 6, further comprising annealing the semiconductor device after implanting the non-dopant material to cause the source and drain areas to expand towards each other and reduce the channel length.

8. The method of claim 7, further comprising performing a second annealing after implanting the non-dopant material to cause the source and drain areas to expand further towards each other and further reduce the channel length.

9. The method of claim 8, further comprising depositing a refractory metal layer on the semiconductor device after the implantation of the non-dopant material, and wherein the annealing and second annealing after implanting the non-dopant material are performed after the deposition of the refractory metal layer, thereby forming metal silicide regions on the semiconductor device.

10. A semiconductor device having an effective channel length less than a printed gate width of the device, comprising:

a gate having a length defined by the physical gate length of the device;

a substrate on which the gate is located, and which contains a doped source area and a doped drain area which extend towards one another underneath the gate; and a channel in the substrate between the source and drain areas, the channel having an effective channel length defined by the nearest distance between the source and drain areas;

wherein the source and drain areas have ion implanted damage caused by non-dopant implantation between 10–30 keV regions, whereby dopants in the source and drain areas have increased mobility in response to temperature elevations to cause the effective channel length to be less than the physical gate length.

11. The semiconductor device of claim 10, wherein the effective channel length is between about 3% to about 20% less than the physical gate length.

12. The semiconductor device of claim 10, wherein the effective channel length is between about 5% to about 9% less than the physical gate length.

* * * * *